(12) United States Patent
Lee et al.

(10) Patent No.: US 11,720,027 B2
(45) Date of Patent: Aug. 8, 2023

(54) APPARATUS FOR GENERATING EXTREME ULTRAVIOLET LIGHT AND LITHOGRAPHY APPARATUS INCLUDING THE SAME

(71) Applicant: Samsung Electronics Co., Ltd., Suwon-si (KR)

(72) Inventors: Injae Lee, Hwaseong-si (KR); Ohkug Kwon, Yongin-si (KR); Sunghyup Kim, Hwaseong-si (KR); Yongchan Kim, Hwaseong-si (KR); Ouiserg Kim, Seongnam-si (KR); Jeonggil Kim, Hwaseong-si (KR); Junghwan Kim, Bucheon-si (KR); Hosun Yoo, Seongnam-si (KR); Daerim Choi, Hwaseong-si (KR); Dongkyeng Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/409,715

(22) Filed: Aug. 23, 2021

(65) Prior Publication Data

US 2022/0082946 A1 Mar. 17, 2022

(30) Foreign Application Priority Data

Sep. 17, 2020 (KR) .......................... 10-2020-0120041
Mar. 23, 2021 (KR) .......................... 10-2021-0037439

(51) Int. Cl.
*H05G 2/00* (2006.01)
*G03F 7/20* (2006.01)
*G03F 7/00* (2006.01)

(52) U.S. Cl.
CPC ...... *G03F 7/70033* (2013.01); *G03F 7/70166* (2013.01); *G03F 7/70858* (2013.01); *G03F 7/70916* (2013.01)

(58) Field of Classification Search
CPC ............. G03F 7/70033; G03F 7/70166; G03F 7/70858; G03F 7/70916; G03F 7/70933
See application file for complete search history.

(56) References Cited

U.S. PATENT DOCUMENTS

| | | | |
|---|---|---|---|
| 7,812,329 B2 | 10/2010 | Bykanov et al. | |
| 8,945,310 B2 | 2/2015 | Zink et al. | |
| 10,232,413 B2 | 3/2019 | Dea et al. | |
| 10,681,795 B2 | 6/2020 | Ershov et al. | |
| 2011/0204249 A1* | 8/2011 | Nagai .................... | H05G 2/005 250/504 R |

(Continued)

*Primary Examiner* — Mesfin T Asfaw
(74) *Attorney, Agent, or Firm* — Muir Patent Law, PLLC

(57) ABSTRACT

An extreme ultraviolet (EUV) light generating apparatus includes a vessel including a first end and a second end opposite to each other and providing an internal space extending from the first end to the second end, a concave mirror adjacent to the first end of the vessel, a droplet generator supplying a droplet to the internal space of the vessel, a laser light source irradiating a laser beam to cause the droplet to emit EUV light, and a gas jet receiving a flow control gas and spraying the received flow control gas into the internal space of the vessel. The gas jet includes a ring-shaped main body including nozzles spaced apart from one another in a circumferential direction. The nozzles spray the received flow control gas in a downward direction.

18 Claims, 8 Drawing Sheets

(56) References Cited

U.S. PATENT DOCUMENTS

| | | |
|---|---|---|
| 2020/0008290 A1 | 1/2020 | Su et al. |
| 2020/0037428 A1 | 1/2020 | Baek et al. |
| 2020/0089124 A1* | 3/2020 | Labetski ............. G03F 7/70175 |
| 2020/0236768 A1 | 7/2020 | Wu et al. |

* cited by examiner

US 11,720,027 B2

APPARATUS FOR GENERATING EXTREME ULTRAVIOLET LIGHT AND LITHOGRAPHY APPARATUS INCLUDING THE SAME

CROSS-REFERENCE TO RELATED APPLICATIONS

This application is based on and claims priority under 35 U. S. C. § 119 to Korean Patent Application Nos. 10-2020-0120041 and 10-2021-0037439, filed on Sep. 17, 2020 and Mar. 23, 2021, respectively, in the Korean Intellectual Property Office, the disclosures of which are incorporated by reference herein in their entirety.

BACKGROUND

The inventive concept relates to an apparatus for generating extreme ultraviolet (EUV) light and a lithography apparatus including the same.

As semiconductor devices are continuously scaled down, a lithography process using extreme ultraviolet (EUV) light is spotlighted as an alternative. A minimum process dimension (i.e., a critical dimension) of a semiconductor circuit formed by the lithography process depends on a wavelength of a light source. Therefore, in order to process a semiconductor device with finer patterns, it is desirable to use a shorter wavelength of the light source used for the lithography process. Because the EUV light has a short wavelength of about 13.5 nm, a semiconductor circuit may be manufactured with finer patterns by using the EUV light. In order to generate the EUV light, a laser-produced plasma (LPP) method of irradiating a laser beam onto a metal droplet such as tin (Sn) is widely used. A contaminated material such as debris of the metal droplet generated in a process of generating the EUV light receives an EUV light source or the EUV light, is attached to parts in the lithography apparatus performing the lithography process, and causes the lithography apparatus to have equipment defects.

SUMMARY

The inventive concept relates to an apparatus for generating extreme ultraviolet (EUV) light with improved reliability and a lithography apparatus including the same.

According to an aspect of the inventive concept, there is provided an EUV light generating apparatus including a vessel including a first end and a second end opposite to each other and providing an internal space extending from the first end to the second end, a concave mirror adjacent to the first end of the vessel, a droplet generator supplying a droplet to the internal space of the vessel, a laser light source irradiating a laser beam to the droplet in the internal space of the vessel, the irradiated droplet emitting EUV light, and a gas jet receiving a flow control gas and spraying the received flow control gas into the internal space of the vessel. The gas jet includes a ring-shaped main body including a plurality of nozzles spaced apart from one another in a circumferential direction. The plurality of nozzles spray the received flow control gas in a downward direction extending from the second end of the vessel to the first end of the vessel.

According to an aspect of the inventive concept, there is provided an EUV light generating apparatus including a vessel including a first end and a second end opposite to each other and providing an internal space extending from the first end to the second end, a concave mirror adjacent to the first end of the vessel, a droplet generator supplying a droplet to the internal space of the vessel, a laser light source irradiating a laser beam to the droplet in the internal space of the vessel, the irradiated droplet emitting EUV light, an exhaust exhausting a gas in the vessel through an exhaust port of the vessel, and a gas jet positioned between the exhaust port of the vessel and the second end of the vessel and spraying a flow control gas into the internal space of the vessel in a downward direction extending from the second end of the vessel to the first end of the vessel. The gas jet includes a ring-shaped main body mounted at an internal wall of the vessel. The ring-shaped main body includes a plurality of nozzles spaced apart from one another in a circumferential direction. Each of the plurality of nozzles is in a form of a slit extending in the circumferential direction of the ring-shaped main body. The plurality of nozzles include eight or more nozzles apart from one another in the circumferential direction of the ring-shaped main body.

According to an aspect of the inventive concept, there is provided a lithography apparatus including an EUV light generating apparatus emitting EUV light that is reflected by a mask provided to the lithography apparatus, and a substrate stage on which a substrate. The EUV light reflected from the mask irradiates on the substrate. The EUV light generating apparatus includes a vessel including a first end and a second end opposite to each other and providing an internal space extending from the first end to the second end, a concave mirror adjacent to the first end of the vessel, a droplet generator supplying a droplet to the internal space of the vessel, a laser light source irradiating a laser beam to the droplet in the internal space of the vessel, the irradiated droplet emitting the EUV light, and a gas jet receiving a flow control gas and spraying the received flow control gas into the internal space of the vessel. The gas jet includes a ring-shaped main body mounted at an internal wall of the vessel and including a plurality of nozzles apart from one another in a circumferential direction. The gas jet sprays the received flow control gas through the plurality of nozzles in a downward direction extending from the second end of the vessel to the first end of the vessel.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
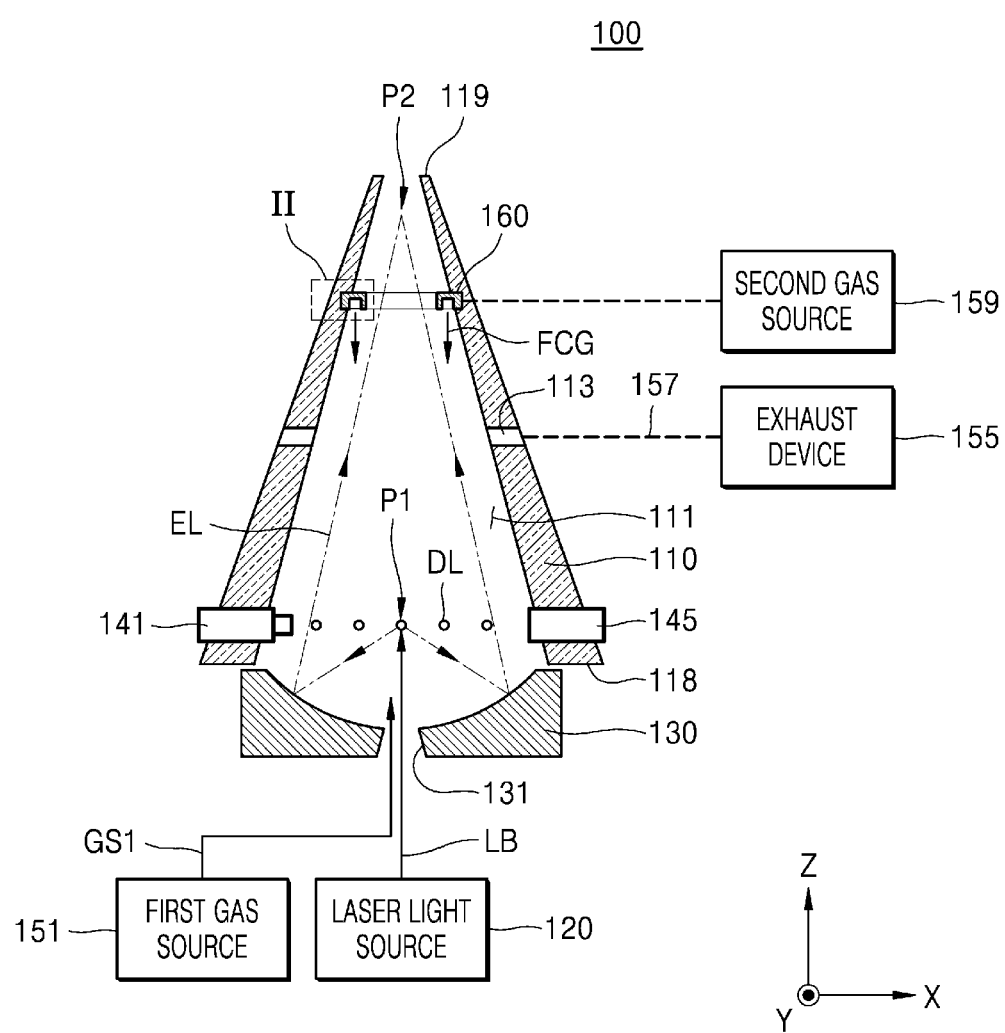
FIG. 1 is a block diagram schematically illustrating an extreme ultraviolet (EUV) light generating apparatus according to exemplary embodiments of the inventive concept.

Hereinafter, embodiments of the inventive concept will be described in detail with reference to the accompanying drawings. Like reference numerals refer to like elements throughout and description thereof will not be given.

Figure 2:
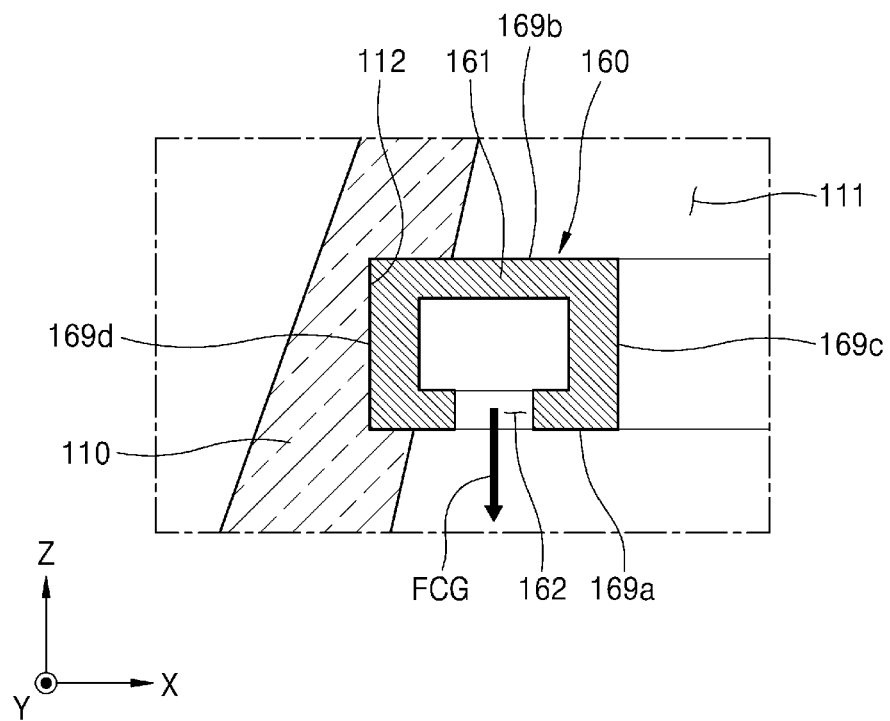
FIG. 2 is a cross-sectional view illustrating the region marked with "II" of FIG. 1.
Figure 3:
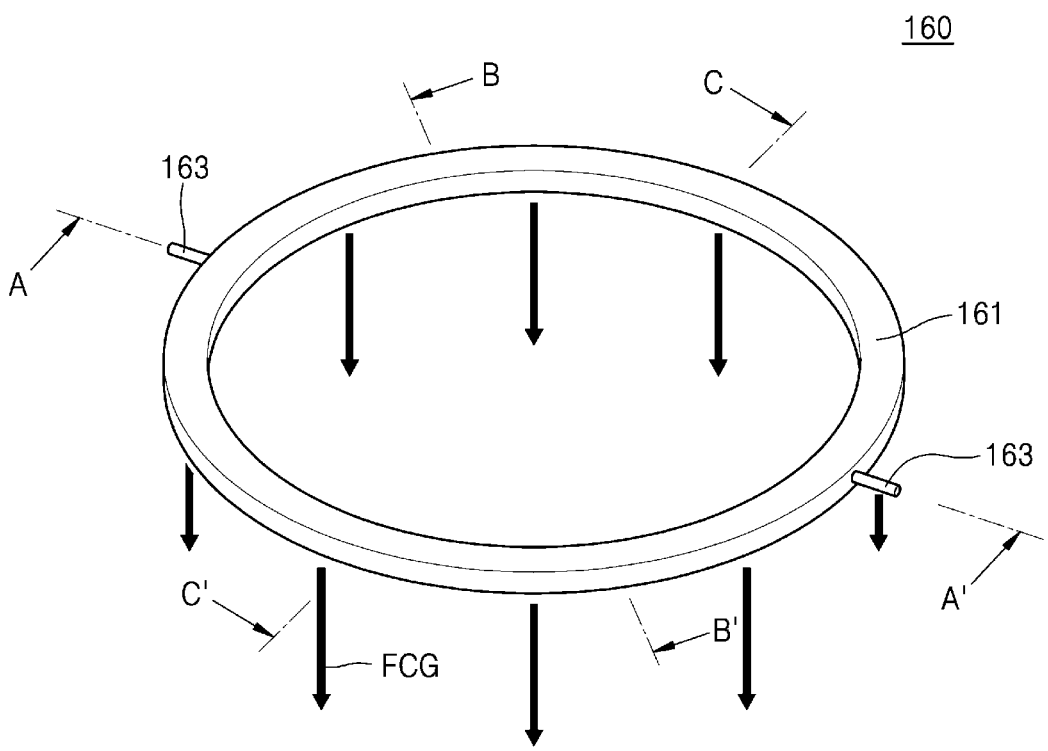
FIG. 3 is a perspective view illustrating a gas jet of the EUV light generating apparatus of FIG. 1.

FIG. 1 is a diagram illustrating an extreme ultraviolet (EUV) light generating apparatus 100 according to exemplary embodiments of the inventive concept. FIG. 2 is a cross-sectional view illustrating the region II of FIG. 1. FIG. 3 is a perspective view illustrating a gas jet 160 of the EUV light generating apparatus 100 of FIG. 1.

Referring to FIGS. 1 to 3, the EUV light generating apparatus 100 may generate EUV light EL for a lithography process. For example, the EUV light EL generated by the EUV light generating apparatus 100 may have a wavelength in a range of from about 4 nm to about 124 nm. In some embodiments, the EUV light EL may have a wavelength in a range of from about 4 nm to about 20 nm. In some embodiments, the EUV light EL may have a wavelength of about 13.5 nm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The EUV light generating apparatus 100 may be a plasma-based light source or a synchrotron radiation light source. The plasma-based light source such as an LPP light source and a discharge-produced plasma (DPP) light source generates plasma and uses light emitted by plasma. In exemplary embodiments, the EUV light generating apparatus 100 may be an LPP light source.

The EUV light generating apparatus 100 may include a vessel 110, a laser light source 120, a collecting mirror 130, a droplet generator 141, a droplet catcher 145, a first gas source 151, an exhaust device 155, a second gas source 159, and the gas jet 160.

The vessel 110 may provide an internal space 111 in which the EUV light EL is generated. For example, the internal space 111 of the vessel 110 may be kept in a vacuum. By keeping the internal space 111 of the vessel 110 in a vacuum, the EUV light EL may be prevented from being absorbed into the air. For example, pressure of the internal space 111 of the vessel 110 may be about 1.0 Torr to about 1.8 Torr.

The vessel 110 may include a first end 118 and a second end 119 opposite to each other. The internal space 111 of the vessel 110 may extend from the first end 118 of the vessel 110 to the second end 119 of the vessel 110. The first end 118 of the vessel 110 may be a portion of the vessel 110 receiving a laser beam LB used for generating the EUV light EL or a portion of the vessel 110 adjacent to the collecting mirror 130. The second end 119 of the vessel 110 may be a portion emitting the EUV light EL generated by the vessel 110.

In exemplary embodiments, the internal space 111 of the vessel 110 may be tapered so that a width thereof decreases from the first end 118 of the vessel 110 to the second end 119 of the vessel 110. For example, the internal space 111 of the vessel 110 may be cone-shaped so that a width thereof decreases from the first end 118 of the vessel 110 to the second end 119 of the vessel 110.

The droplet generator 141 may provide a plurality of droplets DL to the internal space 111 of the vessel 110. The droplet generator 141 may spray the droplets DL at regular intervals. The droplet DL is a raw material for generating the EUV light EL. The EUV light EL may be generated through an interaction between the laser beam LB received by the internal space 111 of the vessel 110 and the droplet DL. For example, the laser beam LB may be irradiated onto the droplet DL. The irradiated droplet DL may absorb the energy of the laser beam LB, and may release the absorbed energy as the EUV light EL.

For example, the droplet DL may include at least one of tin (Sn), lithium (Li), and xenon (Xe). For example, the droplet DL may include at least one of Sn, a tin compound (for example, $SnBr_4$, $SnBr_2$, or SnH), and a tin alloy (for example, Sn—Ga, Sn—In or Sn—In—Ga).

The droplet generator 141 may supply the droplet DL along a path intersecting a traveling path of the laser beam LB received by the internal space 111 of the vessel 110. For example, when the laser beam LB received by the internal space 111 of the vessel 110 travels in a first direction (for example, a Z direction), the droplet generator 141 may spray the droplet DL in a second direction (for example, an X direction or a Y direction) perpendicular to the first direction (for example, the Z direction). For example, the droplet generator 141 may spray the droplet DL on a predetermined first position P1 of the internal space 111 of the vessel 110. In the first position P1 in the vessel 110, a route of the droplet DL intersects the traveling path of the laser beam LB. The EUV light EL may be generated by an interaction between the droplet DL reaching the first position P1 and the laser beam LB (i.e., by an irradiation of the laser beam LB on the droplet at the first position P1).

The droplet catcher 145 may be positioned at an end of the route of the droplet DL sprayed by the droplet generator 141 and may catch the droplet DL sprayed by the droplet generator 141. Among the droplets DL sprayed by the droplet generator 141, some droplets DL that do not interact with the laser beam LB may be caught by the droplet catcher 145.

The laser light source 120 may output the laser beam LB to the internal space 111 of the vessel 110. The laser beam LB provided by the laser light source 120 may be introduced into the vessel 110 through an aperture 131 formed in the center of the collecting mirror 130 and may travel toward the first position P1 in the vessel 110.

In exemplary embodiments, the laser light source 120 may output a gas laser generated by using a gas as a gain medium. For example, the laser light source 120 may output a carbon dioxide ($CO_2$) laser, a helium (He)-Neon (Ne) laser, a nitrogen (N) laser, or an excimer laser.

The collecting mirror 130 may be adjacent to the first end 118 of the vessel 110. The collecting mirror 130 may reflect the EUV light EL formed through the interaction between the laser beam LB and the droplet DL and may collect the EUV light EL in a second position P2 adjacent to the second end 119 of the vessel 110.

The collecting mirror 130 may have an ellipsoidal geometric structure. In some embodiments, the collecting mirror 130 may be a concave mirror such as an elliptical concave mirror. For example, the collecting mirror 130 may have the first position P1 in which the laser beam LB meets the droplet DL as a first focus and the second position P2 in which the EUV light EL reflected from the collecting mirror 130 is collected as a second focus. The second focus may be referred to as an intermediate focus.

The first gas source 151 may supply a gas GS1 to the internal space 111 of the vessel 110. The first gas source 151 may supply the gas GS1 with little reactivity to the internal space 111 of the vessel 110. For example, the gas GS1 supplied by the first gas source 151 may include hydrogen ($H_2$), He, argon (Ar), hydrogen bromide (HBr), or a combination of the above gases. The first gas source 151 may supply the gas GS1 to the internal space 111 of the vessel 110 through an inlet port adjacent to the first end 118 of the vessel 110 and/or the aperture 131 of the collecting mirror 130. In FIG. 1, it is illustrated that the gas GS1 supplied by the first gas source 151 is supplied to the internal space 111 of the vessel 110 through the aperture 131 of the collecting mirror 130. However, the gas GS1 supplied by the first gas source 151 may be introduced into the internal space 111 through a plurality of inlet ports of the vessel 110 adjacent to the first end 118 of the vessel 110.

The exhaust device 155 may remove a gas from the internal space 111 of the vessel 110. The exhaust device 155 may exhaust the gas in the internal space 111 of the vessel 110 through an exhaust port 113 formed at the vessel 110. The exhaust port 113 formed at the vessel 110 may be between the first end 118 and the second end 119 of the vessel 110. The exhaust port 113 may be connected to the internal space 111 of the vessel 110. The vessel 110 may include one exhaust port 113 or a plurality of exhaust ports 113. When the vessel 110 includes a plurality of exhaust ports 113, the plurality of exhaust ports 113 may be positioned at substantially the same height. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The exhaust device 155 may include exhaust pumps connected to the plurality of exhaust ports 113 of the vessel 110 through an exhaust line 157. The exhaust device 155 may further include a regulator for controlling an amount of a gas exhausted through the exhaust line 157 and a scrubber for scrubbing the gas exhausted through the exhaust line 157.

The gas GS1 may be supplied by the first gas source 151 to the internal space 111 of the vessel 110 in an updraft flow that is a gas flow from the first end 118 of the vessel 110 toward the second end 119 of the vessel 110. For example, the gas GS1 supplied by the first gas source 151 may rise from the first end 118 of the vessel 110 toward the second end 119 of the vessel 110 and may be exhausted to the outside of the vessel 110 through the exhaust port 113 of the vessel 110. Such a flow of the gas GS1 may remove a contaminant residing on an internal wall (i.e., an inner surface) of the vessel 110 and a surface of the collecting mirror 130, and may dissipate heat of parts of the vessel 110 and the collecting mirror 130.

The gas jet 160 may receive a flow control gas FCG from the second gas source 159 and may spray the flow control gas FCG into the internal space 111 of the vessel 110. The flow control gas FCG for controlling airflow in the internal space 111 of the vessel 110 may include a gas with little reactivity to the vessel 110. For example, the flow control gas FCG may include or may be formed of an inert gas. For example, the flow control gas FCG may include or may be formed of $H_2$, He, Ar, HBr, or a combination of the above gases. The flow control gas FCG provided by the second gas source 159 may have the same material and/or material composition as those/that of the gas GS1 provided by the first gas source 151 or a material and/or material composition different from those/that of the gas GS1 provided by the first gas source 151.

The gas jet 160 may spray the flow control gas FCG into the internal space 111 of the vessel 110 in a downward direction extending from the second end 119 of the vessel 110 to the first end 118 of the vessel 110. For example, the gas jet 160 may spray the flow control gas FCG toward the collecting mirror 130. The flow control gas FCG may be sprayed by the gas jet 160 in a downdraft flow that is a gas flow from the gas jet 160 adjacent to the second end 119 of the vessel 110 toward the first end 118 of the vessel 110. The flow control gas FCG provided by the gas jet 160 may form the downdraft flow in the internal space 111 of the vessel 110. For example, such downdraft flow of the flow control gas FCG may suppress the updraft flow of the gas GS1 formed in the internal space 111 of the vessel 110.

The gas jet 160 may include a main body 161 and an inlet pipe 163. The inlet pipe 163 may receive the flow control gas FCG provided by the second gas source 159. The inlet pipe 163 may be connected to the main body 161 and may transmit the flow control gas FCG provided by the second gas source 159 to a flow channel of the main body 161.

The main body 161 of the gas jet 160 may be ring-shaped. For example, the main body 161 of the gas jet 160 may be ring-shaped to surround a central axis of the internal space 111, which is cone-shaped, provided by the vessel 110. In exemplary embodiments, a central axis of the main body 161 of the gas jet 160, which is ring-shaped, may coincide with the central axis of the cone-shaped internal space 111 provided by the vessel 110. For example, the main body 161 of the gas jet 160 may include a lower surface 169a and an upper surface 169b opposite to each other, and an outer peripheral surface (i.e., an outer side surface) 169d and an inner peripheral surface (i.e., an inner side surface) 169c opposite to each other. The lower surface 169a of the main body 161 may face the first end 118 of the vessel 110 and the upper surface 169b of the main body 161 may face the second end 119 of the vessel 110. For example, the lower surface 169a may be closer to the first end 118 of the vessel 110 than the second end 119 of the vessel 110, and the upper surface 169b may be closer to the second end 119 of the vessel 110 than the first end 118. The outer peripheral surface 169d of the main body 161 may contact the internal wall of the vessel 110. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to, or "directly disposed on" another element, or as "contacting" or "in contact with" another element, there are no intervening elements present at the point of contact.

The main body 161 of the gas jet 160 may be fixed onto the internal wall of the vessel 110. In exemplary embodiments, the main body 161 of the gas jet 160 may be fixed to the vessel 110 by being inserted into a mounting groove 112 provided in the internal wall of the vessel 110.

In exemplary embodiments, the gas jet 160 may include or may be formed of metal. For example, the gas jet 160 may include or may be formed of aluminum (Al), tungsten (W), or a combination of Al and W. Alternatively, in exemplary embodiments, the gas jet 160 may include or may be formed of ceramic or polymer. For example, the gas jet 160 may include or may be formed of glass, quartz, or Teflon.

The main body 161 of the gas jet 160 may include a plurality of nozzles 162 spaced apart from one another in a circumferential direction. In some embodiments, each of the plurality of nozzles 162 may be an opening of the main body 161. The opening may be formed at the lower surface 169a and connected to a region enclosed by the main body 161. The gas jet 160 may spray the flow control gas FCG into the internal space 111 of the vessel 110 through the plurality of nozzles 162. The flow control gas FCG may be sprayed into the internal space 111 of the vessel 110 through the plurality of nozzles 162 in a constant direction. The flow control gas FCG sprayed on the internal space 111 of the vessel 110 through the plurality of nozzles 162 may have the downdraft that is the gas flow in a direction extending from the second end 119 of the vessel 110 to the first end 118 of the vessel 110. For example, the flow control gas FCG may be sprayed into the internal space 111 of the vessel 110 through the plurality of nozzles 162 in an angle in a predetermined angular range with respect to a reference direction (RD of FIG. 5). The reference direction RD may be a direction of the central axis of the internal space 111, which is cone-shaped, or a direction from the second position P2 of the vessel 110 to the first position P1 of the vessel 110. For example, a flowing direction of the flow control gas FCG sprayed from each of the plurality of nozzles 162 of the gas jet 160 may be inclined with respect to the reference direction RD. The flowing direction of the flow control gas FCG sprayed from each of the plurality of nozzles 162 of the gas jet 160 may have a distribution with an angular range of about −30° to about +30° with respect to the reference direction RD.

The flow control gas FCG with the same flux may be sprayed into the internal space 111 of the vessel 110 through the plurality of nozzles 162. For example, each of the plurality of nozzles 162 may spray the same flux of the flow control gas FCG. The gas jet 160 may provide a uniform downdraft in the circumferential direction of the gas jet 160 by spraying the flow control gas FCG through the plurality of nozzles 162 in the constant direction and with uniform flux. The plurality of nozzles 162 may be spaced apart from one another in the circumferential direction.

The gas jet 160 may be adjacent to the second position P2 in which the EUV light EL reflected from the collecting mirror 130 is collected (i.e., focused). The gas jet 160 may be mounted in the internal space 111 of the vessel 110 between the exhaust port 113 of the vessel 110 and the second end 119 of the vessel 110 (i.e., mounted at the internal wall of the vessel 110). The gas jet 160 may be positioned at a first height with reference to the first end 118 of the vessel 110. The exhaust port 113 of the vessel 110 may be positioned at a second height with reference to the first end 118 of the vessel 110. The first height may be greater than the second height.

The gas jet 160 may prevent the updraft formed in the internal space 111 of the vessel 110 from moving toward the second end 119 of the vessel 110 beyond a mounting position of the gas jet 160 and may purge the gas of the internal space 111 of the vessel 110 and the contaminant included in the gas of the internal space 111 of the vessel 110 to the outside of the vessel 110 through the exhaust port 113 by spraying the flow control gas FCG downward (that is, in a direction extending from the second end 119 of the vessel 110 to the first end 118 of the vessel 110).

A spitting phenomenon, in which debris of the droplets DL is accumulated on the internal wall of the vessel 110 adjacent to the second end 119 of the vessel 110 and interacts with the gas of the internal space 111 of the vessel 110 to grow into particles each having a size of about 1 micrometer, may occur in the vessel 110. The particles generated by the spitting phenomenon may be emitted to the outside of the vessel 110 through the second end 119 of the vessel 110. The particles generated by the spitting phenomenon are emitted to the outside through the second end 119 of the vessel 110. The particles may be attached to other parts of a lithography apparatus and may cause the lithography apparatus to have equipment defects. For example, when the particles generated by the spitting phenomenon are attached to a mask, the reliability of the lithography process may remarkably deteriorate due to mask defects.

In exemplary embodiments, the gas jet 160 may prevent the updraft from rising along the internal wall of the vessel 110 by being mounted around the second end 119 of the vessel 110 and spraying the flow control gas FCG downward. Therefore, because the debris of the droplet DL is prevented from moving near the second end 119 of the vessel 110 with the airflow rising along the internal wall of the vessel 110, the debris of the droplet DL may be prevented from being accumulated near the second end 119 of the vessel 110. The debris of the droplet DL is prevented from being accumulated near the second end 119 of the vessel 110, and the mask defects caused by the particles generated by the spitting phenomenon may be reduced and the reliability of the lithography process by using the lithography apparatus may be improved.

Figure 4:
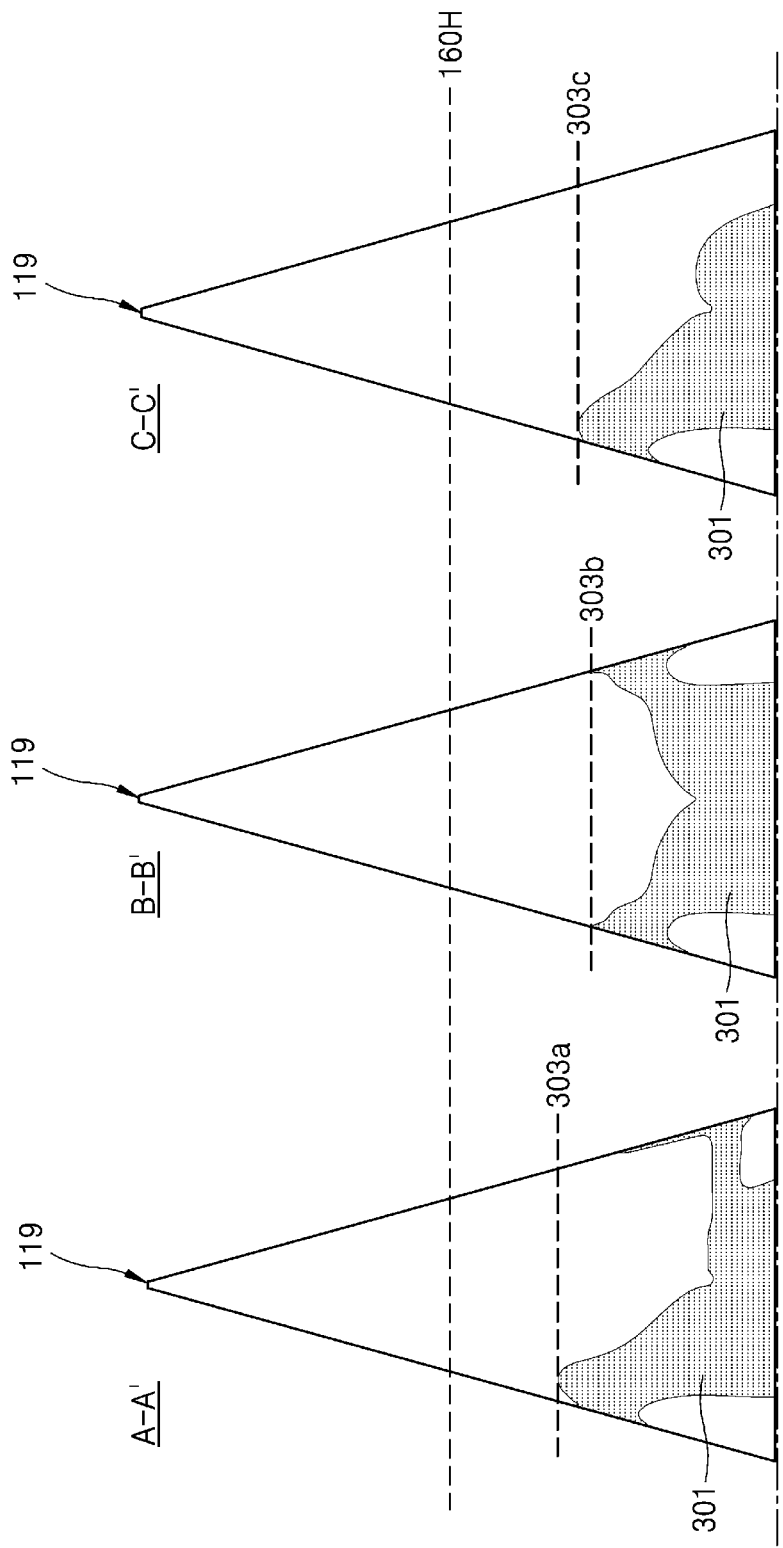
FIG. 4 is a view illustrating an airflow simulation result in an internal space of a vessel.

FIG. 4 is a view illustrating an airflow simulation result in the internal space 111 of the vessel 110.

In FIG. 4, on cross-sections of the internal space 111 of the vessel 110, which are taken along the lines A-A', B-B', and C-C' of FIG. 3, an airflow 301 including the debris of the droplet DL is illustrated.

Referring to FIG. 4 together with FIGS. 1 to 3, because the gas jet 160 provides the downdraft having the constant direction and the uniform flux in the circumferential direction of the gas jet 160, it may be noted that the rise of the airflow 301 including the debris of the droplet DL is suppressed over the whole region of the internal space 111. For example, it may be noted that a height 303a of the airflow 301 including the debris of the droplet DL in the cross-section taken along the line A-A', a height 303b of the airflow 301 including the debris of the droplet DL in the cross-section taken along the line B-B', and a height 303c of the airflow 301 including the debris of the droplet DL in the cross-section taken along the line C-C' are less than a mounting height 160H of the gas jet 160.

When the downdraft provided by the gas jet 160 is not uniform in the circumferential direction of the gas jet 160, there is a high probability that the airflow 301 including the debris of the droplet DL may reach an upper region of the internal space 111, which is adjacent to the second end 119 of the vessel 110, beyond the mounting height 160H of the gas jet 160 through a portion in which the downdraft is weak.

In exemplary embodiments, the gas jet 160 may provide the uniform downdraft to the internal space 111 in the circumferential direction of the gas jet 160 so that a high level of consistency for flow control is provided. Therefore, because the rise of the airflow 301 along the internal wall of the vessel 110 is uniformly suppressed over the whole region of the internal space 111, a point in which the rise of the airflow 301 is not suppressed well may be removed. Therefore, because the debris of the droplet DL is prevented from being accumulated near the second end 119 of the vessel 110, the equipment defects and mask defects caused by the particles generated by the spitting phenomenon may be reduced and the reliability of the lithography process using the lithography apparatus may increase.

Figure 5:
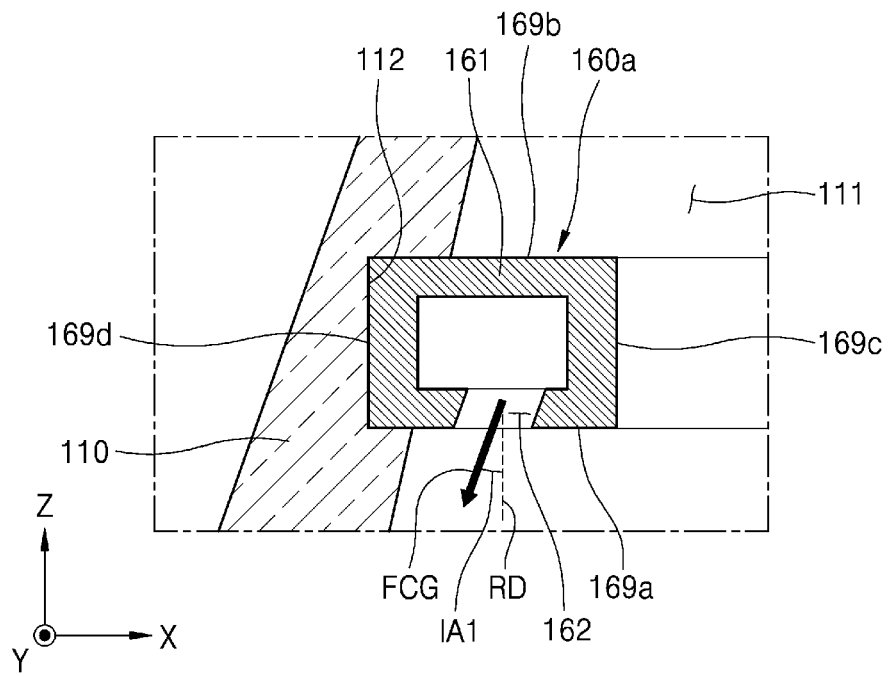
FIG. 5 is a cross-sectional view illustrating a part of an EUV light generating apparatus including a gas jet according to exemplary embodiments of the inventive concept.

FIG. 5 is a cross-sectional view illustrating a part of an EUV light generating apparatus including a gas jet 160a according to exemplary embodiments of the inventive concept. In FIG. 5, a portion corresponding to the region II of FIG. 1 is illustrated.

Referring to FIG. 5, the gas jet 160a may spray the flow control gas FCG in a direction inclined at a constant angle radially outward with respect to the reference direction RD. A plurality of nozzles 162 provided in the gas jet 160a are exposed through a lower surface 169a of a main body 161 of the gas jet 160a and extend in the direction inclined at the constant angle radially outward with respect to the reference direction RD so as to spray the flow control gas FCG in the direction inclined at the constant angle radially outward with respect to the reference direction RD. For example, each of the plurality of nozzles 162 may be an opening of the main body 161. The opening may have an inclined sidewall extending at a first inclined angle (e.g., an angle IA1) with respect to the reference direction RD so that the downdraft flow generated from the opening of the gas jet 160a may be directed toward the internal wall of the vessel 110.

In exemplary embodiments, an angle IA1 between the direction in which the flow control gas FCG is sprayed through the plurality of nozzles 162 and the reference direction RD may be greater than about 0° and less than about 30° (i.e., may be in a range of from about 0° and about) 30°.

Figure 6:
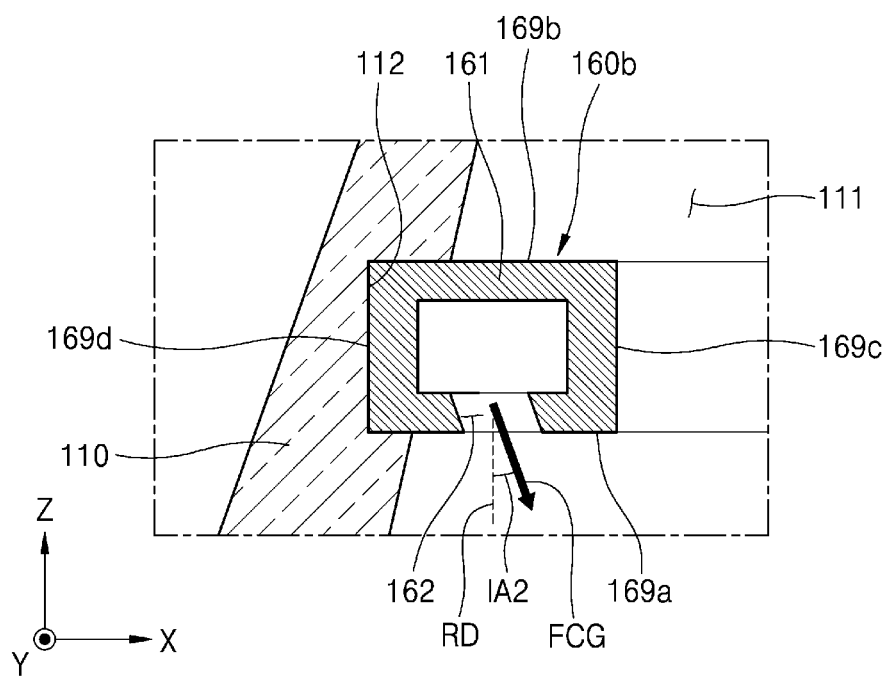
FIG. 6 is a cross-sectional view illustrating a part of an EUV light generating apparatus including a gas jet according to exemplary embodiments of the inventive concept.

FIG. 6 is a cross-sectional view illustrating a part of an EUV light generating apparatus including a gas jet 160b according to exemplary embodiments of the inventive concept. In FIG. 6, a portion corresponding to the region II of FIG. 1 is illustrated.

Referring to FIG. 6, the gas jet 160b may spray the flow control gas FCG in a direction inclined at a constant angle radially inward with respect to the reference direction RD. A plurality of nozzles 162 provided in the gas jet 160b are exposed through a lower surface 169a of a main body 161 of the gas jet 160b and extend in the direction inclined at the constant angle radially inward with respect to the reference direction RD so as to spray the flow control gas FCG in the direction inclined at the constant angle radially inward with respect to the reference direction RD. For example, each of the plurality of nozzles 162 may be an opening of the main body 161. The opening may have an inclined sidewall extending a second inclined angle (e.g., an angle IA2) with respect to the reference direction RD so that the downdraft flow generated from the opening of the gas jet 160a may be directed away from the internal wall of the vessel 110.

In exemplary embodiments, an angle IA2 between the direction in which the flow control gas FCG is sprayed through the plurality of nozzles 162 and the reference direction RD may be greater than about 0° and less than about 30° (i.e., may be in a range of from about 0° and about) 30°.

Figure 7:
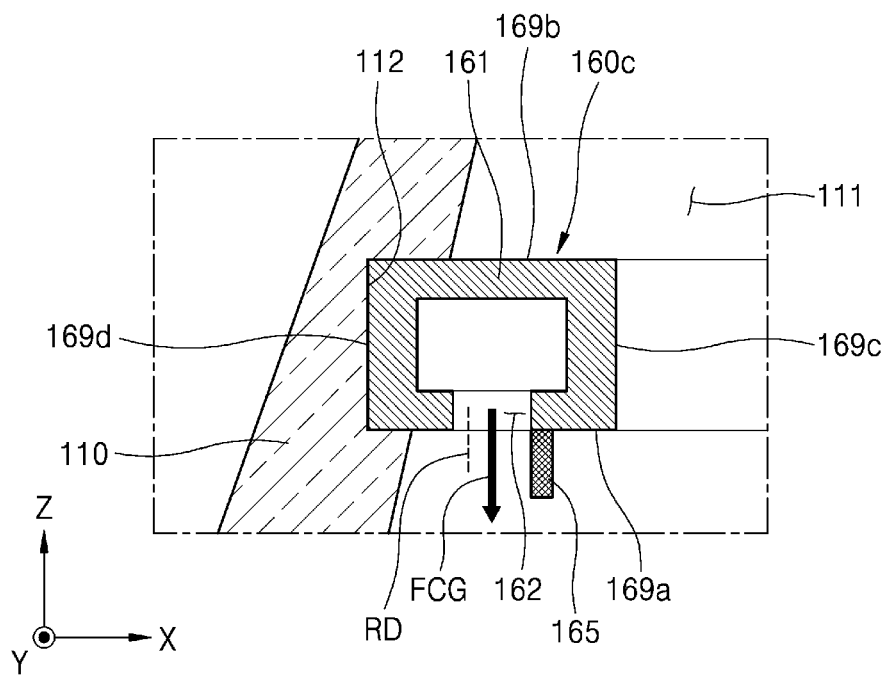
FIG. 7 is a cross-sectional view illustrating a part of an EUV light generating apparatus including a gas jet according to exemplary embodiments of the inventive concept.

FIG. 7 is a cross-sectional view illustrating a part of an EUV light generating apparatus including a gas jet 160c according to exemplary embodiments of the inventive concept. In FIG. 7, a portion corresponding to the region II of FIG. 1 is illustrated.

Referring to FIG. 7, the gas jet 160c may include a plurality of flow guide plates 165 connected to a main body 161 and controlling a direction in which the flow control gas FCG is sprayed through a plurality of nozzles 162. The plurality of flow guide plates 165 may extend downward from a lower surface 169a of the main body 161. The plurality of flow guide plates 165 may extend from the lower surface 169a of the main body 161 in the reference direction RD.

The plurality of flow guide plates 165 may extend in a circumferential direction of the main body 161 of the gas jet 160c. For example, each of the plurality of nozzles 162 is in the form of a slit extending in the circumferential direction of the main body 161 of the gas jet 160c, and each of the plurality of flow guide plates 165 may extend in the circumferential direction to have a length corresponding to a length of each of the plurality of nozzles 162 in the circumferential direction. For example, the length of each of the plurality of flow guide plates 165 in the circumferential direction may be equal to or greater than the length of each of the plurality of nozzles 162 in the circumferential direction.

The number of flow guide plates 165 provided in the gas jet 160c may be equal to the number of nozzles 162. For example, the gas jet 160c includes the plurality of nozzles 162 spaced apart from one another in the circumferential direction, and each of the plurality of flow guide plates 165 for guiding the flow control gas FCG may be arranged on an exit side of a corresponding one of the plurality of nozzles 162.

In exemplary embodiments, in order to control a flow direction of the flow control gas FCG sprayed through the plurality of nozzles 162, the direction in which the plurality of flow guide plates 165 extend may be controlled. In some embodiment, the flow control gas FCG sprayed through each of the plurality of nozzles 162 may flow along an extending surface of a corresponding flow guide plate 165. In some embodiment, each of the plurality of nozzles 162 may be an opening of the main body 161, and a sidewall of the opening and an extending surface of a corresponding flow guide plate 165 may extend in the reference direction RD and may be connected with each other. Each of the plurality of guide plates 165 may be arranged on an exit side of a corresponding nozzle as shown in FIGS. 5 and 6, as shown in FIG. 7. In FIGS. 5 and 6, the sidewalls of the openings of the main body 161, which are the plurality of nozzles 162, are inclined at the angles IA1 and IA2, respectively, and extending surfaces of a plurality of guide plates in FIG. 5 may extend at the angle IA1 with respect to the reference direction RD, and extending surfaces of a plurality of guide plates in FIG. 6 may extend at the angle IA2 with reference to the reference direction RD.

In exemplary embodiments, like in the direction in which the flow control gas FCG is sprayed by the gas jet 160a as illustrated with reference to FIG. 5, the plurality of flow guide plates 165 may guide the flow control gas FCG in the direction inclined at the constant angle radially outward with respect to the reference direction RD. The plurality of flow guide plates 165 may extend in the direction inclined at the constant angle radially outward with respect to the reference direction RD from the lower surface 169a of the main body 161 so that the flow control gas FCG may flow to be inclined radially outward with respect to the reference direction RD.

In exemplary embodiments, like in the direction in which the flow control gas FCG is sprayed by the gas jet 160b as illustrated with reference to FIG. 6, the plurality of flow guide plates 165 may guide the flow control gas FCG in the direction inclined at the constant angle radially inward with respect to the reference direction (RD of FIG. 6). So that the flow control gas FCG flows to be inclined radially inward with respect to the reference direction (RD of FIG. 6), the plurality of flow guide plates 165 may be arranged between the internal wall of the vessel 110 and the plurality of nozzles 162 and may extend in the direction inclined at the constant angle radially inward with respect to the reference direction (RD of FIG. 6) from the lower surface 169a of the main body 161.

Figure 8:
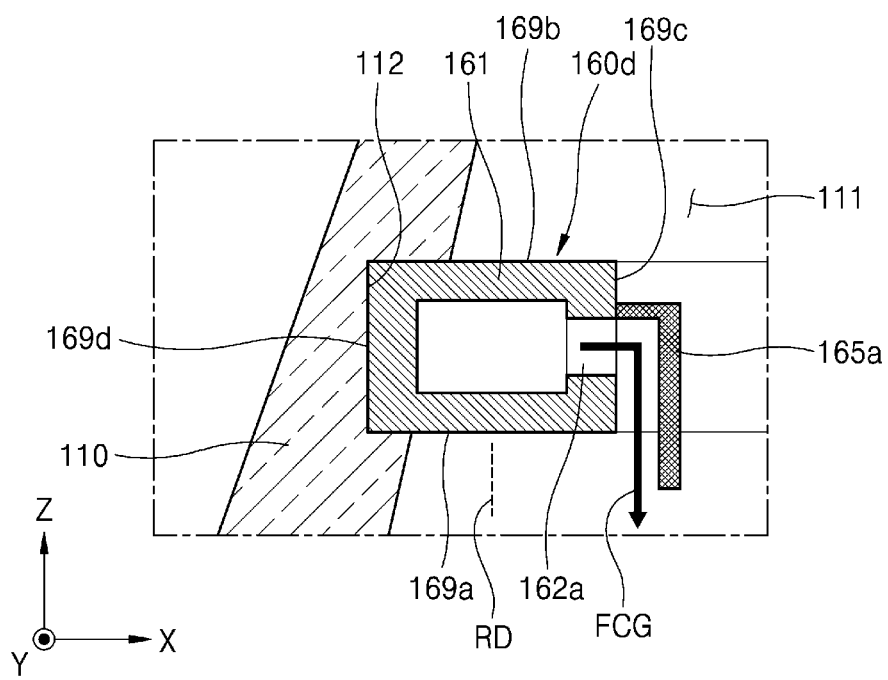
FIG. 8 is a cross-sectional view illustrating a part of an EUV light generating apparatus including a gas jet according to exemplary embodiments of the inventive concept.

FIG. 8 is a cross-sectional view illustrating a part of an EUV light generating apparatus including a gas jet 160d according to exemplary embodiments of the inventive concept. In FIG. 8, a portion corresponding to the region II of FIG. 1 is illustrated.

Referring to FIG. 8, a plurality of nozzles 162a of the gas jet 160d may be exposed through an inner peripheral surface 169c of a main body 161 and the flow control gas FCG may be sprayed through the plurality of nozzles 162a. The gas jet 160d may include a plurality of flow guide plates 165a arranged on the inner peripheral surface 169c of the main body 161 and controlling a direction in which the flow control gas FCG is sprayed through the plurality of nozzles 162a. The plurality of flow guide plates 165a may extend downward so as to cover the plurality of nozzles 162a provided in the inner peripheral surface 169c of the main body 161 and so that the flow control gas FCG has the downdraft. The plurality of flow guide plates 165a may extend downward (that is, in a direction extending from the second end 119 of the vessel 110 to the first end 118 of the vessel 110 or toward the controlling mirror 130) from an upper end connected to the inner peripheral surface 169c of the main body 161. For example, each of the plurality of flow guide plates 165a may include an upper end connected to the inner peripheral surface 169c of the main body 161, and a portion extending downward from the upper end toward the controlling mirror 130. An upper end of each flow guide plate 165a may be arranged on an exit side of a corresponding nozzle as shown in FIG. 7, except that the opening of the main body 161 is formed at the inner peripheral surface 169c.

The plurality of flow guide plates 165a may extend in a circumferential direction of the main body 161 of the gas jet 160d. For example, each of the plurality of nozzles 162a is in the form of a slit extending in the circumferential direction of the main body 161 of the gas jet 160d, and each of the plurality of flow guide plates 165a may extend in the circumferential direction to have a length corresponding to a length of each of the plurality of nozzles 162a in the circumferential direction. For example, the length of each of the plurality of flow guide plates 165a in the circumferential direction may be equal to or greater than the length of a corresponding one of the plurality of nozzles 162a in the circumferential direction.

The number of flow guide plates 165a provided in the gas jet 160d may be equal to the number of nozzles 162a. For example, the gas jet 160d includes the plurality of nozzles 162a spaced apart from one another in the circumferential direction, and each of the plurality of flow guide plates 165a for guiding the flow control gas FCG may be arranged on an exit side of each of the plurality of nozzles 162a.

In exemplary embodiments, in order to control a flow direction of the flow control gas FCG sprayed through the plurality of nozzles 162a, the direction in which the plurality of flow guide plates 165a extend may be controlled. In some embodiment, the flow control gas FCG sprayed through each of the plurality of nozzles 162a may flow along an extending surface of a corresponding flow guide plate 165a. In some embodiment, each of the plurality of nozzles 162a may be an opening of the main body 161, and a sidewall of the opening and an extending surface of a corresponding flow guide plate 165a may be connected with each other. Each of the plurality of guide plates 165a may be arranged on an exit side of a corresponding nozzle as shown in FIG. 8.

In exemplary embodiments, like in the direction in which the flow control gas FCG is sprayed by the gas jet 160a as illustrated with reference to FIG. 5, the plurality of flow guide plates 165a may guide the flow control gas FCG in the direction inclined at the constant angle radially outward with respect to the reference direction RD. The plurality of flow guide plates 165a may extend in the direction inclined at the constant angle radially outward with respect to the reference direction RD from the upper end connected to the inner peripheral surface 169c of the main body 161 so that the flow control gas FCG may flow in the direction inclined at the constant angle radially outward with respect to the reference direction RD.

In exemplary embodiments, like in the direction in which the flow control gas FCG is sprayed by the gas jet 160b as illustrated with reference to FIG. 6, the plurality of flow guide plates 165a may guide the flow control gas FCG in the direction inclined at the constant angle radially inward with respect to the reference direction (RD of FIG. 6). The plurality of flow guide plates 165a may extend in the direction inclined at the constant angle radially inward with respect to the reference direction (RD of FIG. 6) from the upper end connected to the inner peripheral surface 169c of the main body 161 and may guide the flow control gas FCG in the direction inclined at the constant angle radially inward with respect to the reference direction (RD of FIG. 6).

Figure 9:
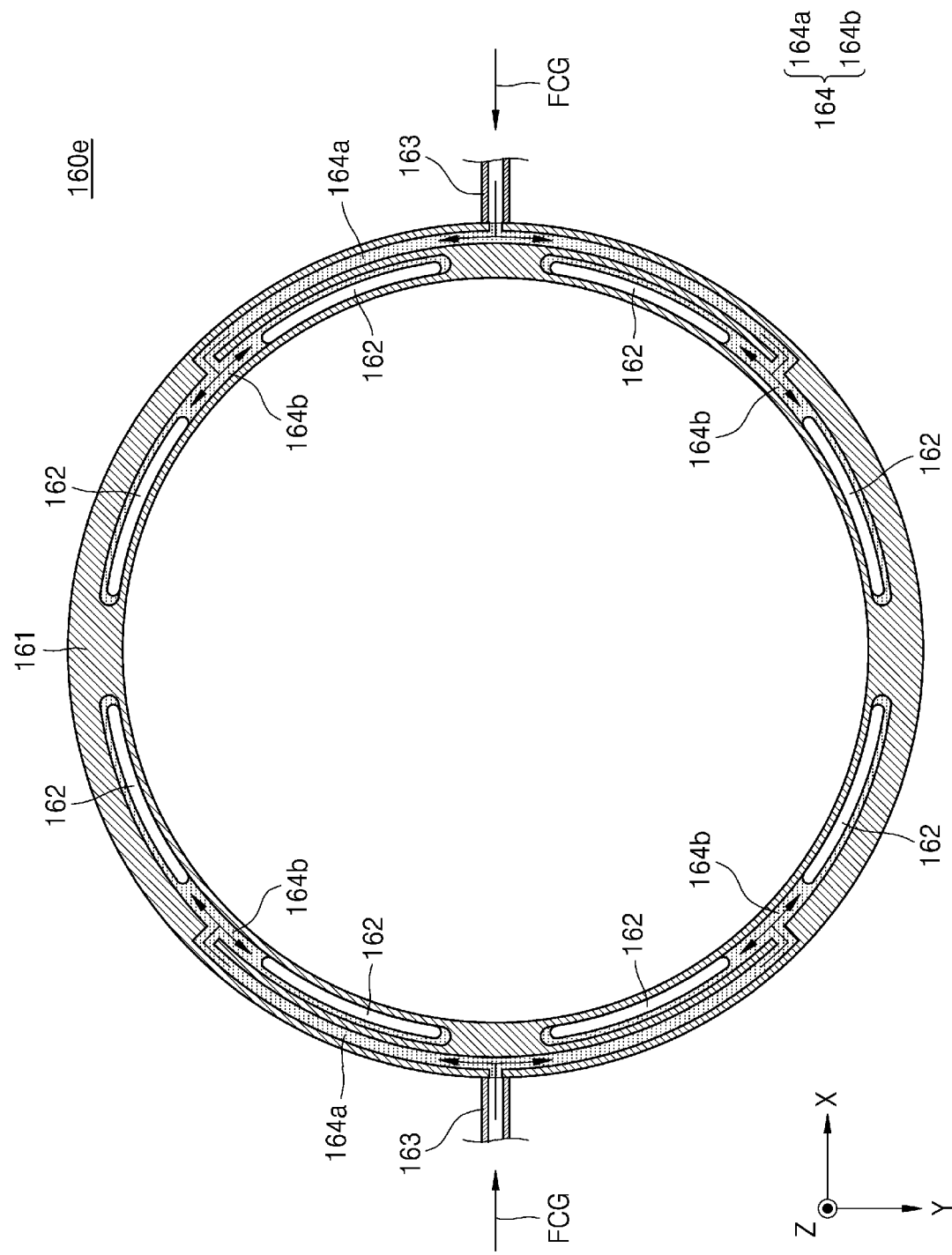
FIG. 9 is a cross-sectional view illustrating a horizontal cross-section of a gas jet according to exemplary embodiments of the inventive concept.

FIG. 9 is a cross-sectional view illustrating a horizontal cross-section of a gas jet 160e according to exemplary embodiments of the inventive concept.

Referring to FIG. 9 together with FIGS. 1 and 2, the gas jet 160e may include a plurality of nozzles 162 spaced apart from one another in a circumferential direction of a main body 161. The plurality of nozzles 162 may be exposed through a lower surface 169a of the main body 161 and may spray the flow control gas FCG downward. Each of the plurality of nozzles 162 may be in the form of a slit extending in the circumferential direction of the main body 161.

In exemplary embodiments, lengths of the plurality of nozzles 162 extending in the circumferential direction of the main body 161 may be equal to one another. A distance between two adjacent nozzles among the plurality of nozzles 162 may be constant.

In FIG. 9, the gas jet 160e is illustrated as including eight nozzles 162. However, the number of nozzles 162 included in the gas jet 160e may be less than or greater than 8.

The main body 161 of the gas jet 160e may include distribution channels 164 dividing the flow control gas FCG transmitted by inlet pipes 163 and transmitting the divided flow control gas FCG to the two or more nozzles 162.

In exemplary embodiments, the distribution channels 164 may include first distribution channels 164a and second distribution channels 164b. Each of the first distribution channels 164a may be connected to a corresponding one of the inlet pipes 163 and may extend from an exit of the corresponding one of the inlet pipes 163 to two second distribution channels 164b. For example, each first distribution channel 164a may have a first end connected to one of the two second distribution channels 164b, and a second end connected to the other of the two second distribution channels 164b. Each of the second distribution channels 164b may extend from each of exits of the first distribution channels 164a to the two nozzles 162. For example, each second distribution channel 164b may include a first end connected to one of the two nozzles 162, and a second end connected to the other of the two nozzles 162. Each of the first distribution channels 164a may transmit the flow control gas FCG transmitted through each of the inlet pipes 163 to the two second distribution channels 164b. For example, the flow control gas FCG transmitted to each of the first distribution channels 164a through each of the inlet pipes 163 may be divided into two paths in each of the first distribution channels 164a. The two second distribution channels 164b may be connected to opposite ends of the two paths of each of the first distribution channels 164a, respectively. Each of the two second distribution channels 164b may transmit the flow control gas FCG transmitted by each of the first distribution channels 164a to the two nozzles 162. For example, the flow control gas FCG transmitted to the two second distribution channels 164b through each of the first distribution channels 164a may be divided into two paths (i.e., two divided flows) in the two second distribution channels 164b.

In exemplary embodiments, a diameter (or a width) of each of the first distribution channels 164a and the second distribution channels 164b may be in a range of from about 1 mm to about 10 mm.

As illustrated in FIG. 9, the gas jet 160e may include the two inlet pipes 163 connected to opposite sides of the main body 161 thereof. Each of the two inlet pipes 163 may be connected to the four nozzles 162 through the one first distribution channel 164a and the two second distribution channels 164b. For example, a flow of the flow control gas FCG transmitted through the one inlet pipe 163 may be divided into two divided flows of the flow control gas FCG, and each of the divided flows of the flow control gas FCG may be transmitted to corresponding four nozzles 162 through the one distribution channel 164 of the main body 161. Because the flow control gas FCG may be uniformly transmitted to the plurality of nozzles 162 through the distribution channels 164 of the main body 161, the flow control gas FCG with the uniform flux may be sprayed through the plurality of nozzles 162.

In FIG. 9, it is illustrated that the flow control gas FCG is divided twice until the flow control gas FCG reaches each of the plurality of nozzles 162 from the one inlet pipe 163 so that the one inlet pipe 163 is connected to the four nozzles 162. However, the number of nozzles 162 connected to the one inlet pipe 163 may be greater than 4. For example, the distribution channel 164 may be configured so that the flow control gas FCG is divided three times until the flow control gas FCG reaches each of the plurality of nozzles 162 from the one inlet pipe 163 so that the one inlet pipe 163 is connected to the eight nozzles 162.

Figure 10:
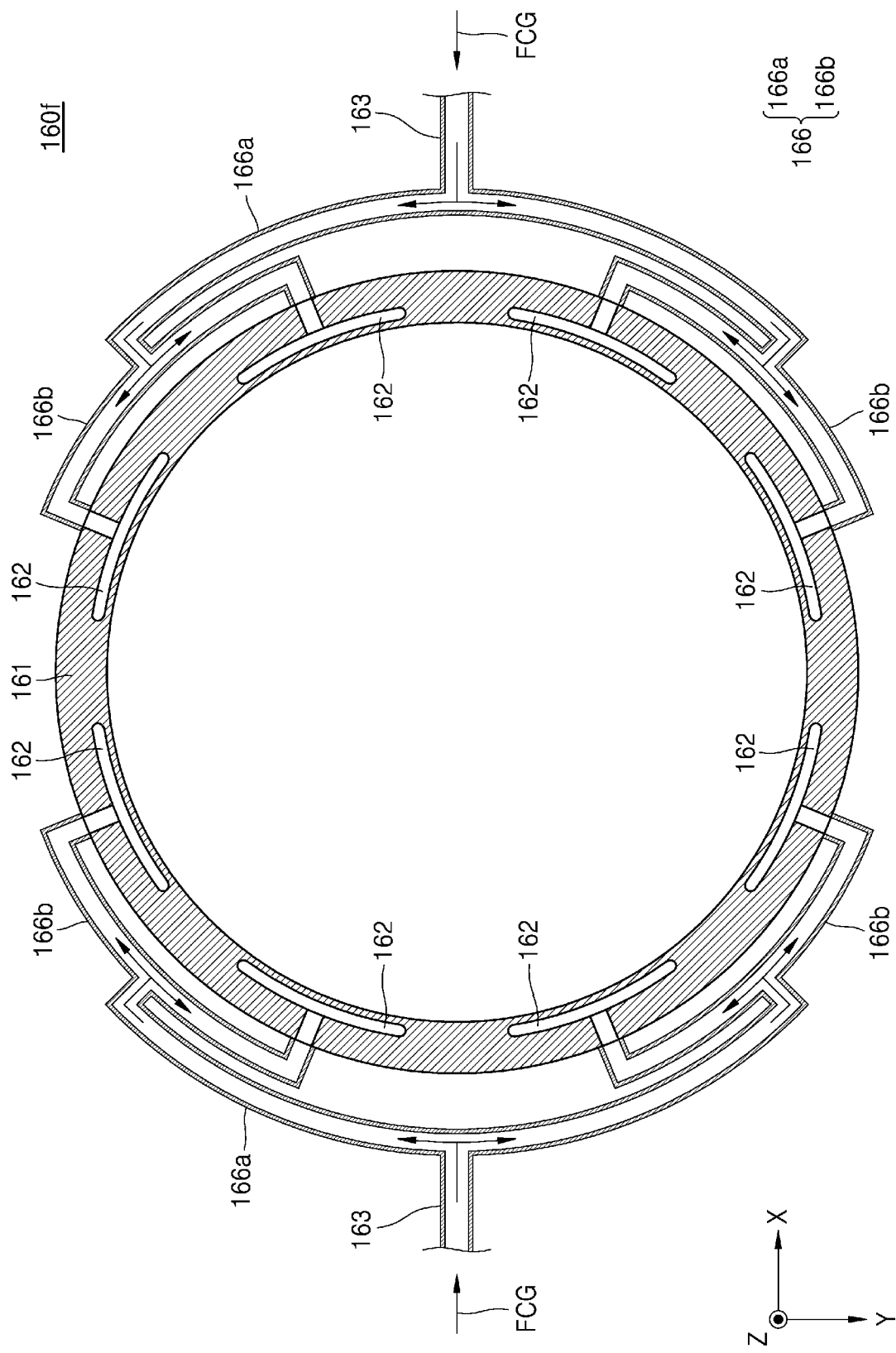
FIG. 10 is a cross-sectional view illustrating a horizontal cross-section of a gas jet according to exemplary embodiments of the inventive concept.

FIG. 10 is a cross-sectional view illustrating a horizontal cross-section of a gas jet 160f according to exemplary embodiments of the inventive concept.

Referring to FIG. 10 together with FIGS. 1 and 2, the gas jet 160f may include branch pipes 166 extending between inlet pipes 163 and a main body 161. The branch pipes 166 may be connected to the main body 161 so that internal channels of the branch pipes 166 are connected to an internal channel of the main body 161. The branch pipes 166 may divide the flow control gas FCG transmitted by the inlet pipes 163 and may transmit the divided flow control gas FCG to two or more nozzles 162 provided in the main body 161.

In exemplary embodiments, the branch pipes 166 may include first branch pipes 166a and second branch pipes 166b. Each of the first branch pipes 166a may be connected to a corresponding one of the inlet pipes 163 and may extend from an exit of the corresponding one of the inlet pipes 163 to two second branch pipes 166b. For example, each first branch pipe 166a may have a first end connected to one of the two second branch pipes 166b, and a second end connected to the other of the two second branch pipes 166b. Each of the second branch pipes 166b may extend from each of exits of the first branch pipes 166a to the two nozzles 162 provided in the main body 161. For example, each second branch pipe 166b may include a first end connected to one of the two nozzles 162, and a second end connected to the other of the two nozzles 162. Each of the first branch pipes 166a may transmit the flow control gas FCG transmitted through each of the inlet pipes 163 to the two second branch pipes 166b. For example, the flow control gas FCG transmitted to each of the first branch pipes 166a through each of the inlet pipes 163 may be divided into two paths through the divided channels of each of the first branch pipes 166a. The two second branch pipes 166b may be respectively connected to opposite ends of the two paths of each of the first branch pipes 166a. Each of the two second branch pipes 166b may transmit the flow control gas FCG transmitted by each of the first branch pipes 166a to the two nozzles 162. For example, the flow control gas FCG transmitted to the second branch pipes 166b through each of the first branch pipes 166a may be divided into two paths (i.e., two divided flows) in the second branch pipes 166b.

In exemplary embodiments, a diameter (or a width) of each of the channels of the first branch pipes 166a and the channels of the second branch pipes 166b may be in a range of from about 1 mm to about 10 mm.

As illustrated in FIG. 10, the gas jet 160f may include the two inlet pipes 163 combined with opposite sides of the main body 161 thereof. Each of the two inlet pipes 163 may be connected to the four nozzles 162 through the one first branch pipe 166a and the two second branch pipes 166b. For example, a flow of the flow control gas FCG transmitted through the one inlet pipe 163 may be divided into two divided flows of the flow control gas FCG, and each of the divided flows of the flow control gas FCG may be transmitted to corresponding four nozzles 162 through the one branch pipe 166. Because the flow control gas FCG may be uniformly separated by the branch pipes 166 and may be supplied to the plurality of nozzles 162, the flow control gas FCG with the uniform flux may be sprayed through the plurality of nozzles 162.

In FIG. 10, it is illustrated that the flow control gas FCG is divided twice until the flow control gas FCG reaches each of the plurality of nozzles 162 from the one inlet pipe 163 so that the one inlet pipe 163 is connected to the four nozzles 162. However, the number of nozzles 162 connected to the one inlet pipe 163 may be greater than 4. For example, the branch pipe 166 may be configured so that the flow control gas FCG is divided three times until the flow control gas FCG reaches each of the plurality of nozzles 162 from the one inlet pipe 163 so that the one inlet pipe 163 is connected to the eight nozzles 162.

Figure 11:
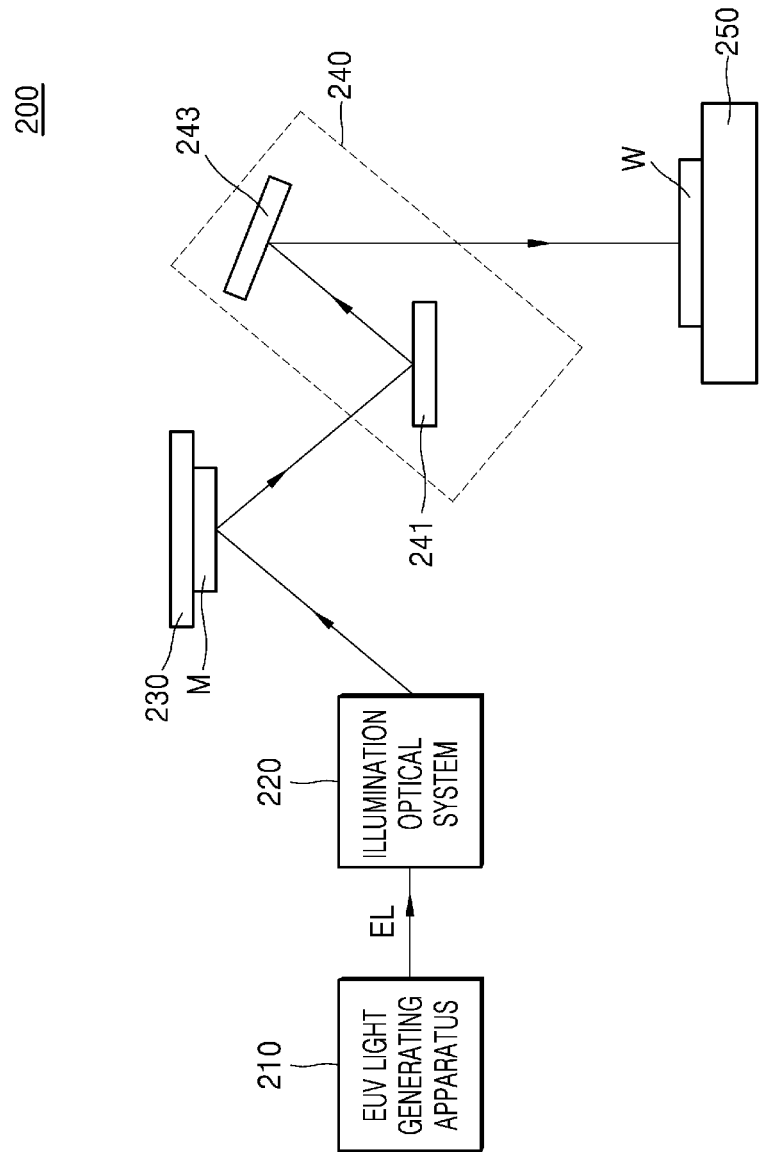
FIG. 11 is a block diagram schematically illustrating a lithography apparatus according to exemplary embodiments of the inventive concept.

FIG. 11 is a block diagram schematically illustrating a lithography apparatus 200 according to exemplary embodiments of the inventive concept.

Referring to FIG. 11 together with FIGS. 1 to 3, the lithography apparatus 200 may include an EUV light generating apparatus 210, an illumination optical system 220, a mask support 230, a projection optical system 240, and a substrate stage 250. The EUV light generating apparatus 210 included in the lithography apparatus 200 may output EUV light EL, and the lithography apparatus 200 may perform a lithography process by using the EUV light EL. The EUV light generating apparatus 210 may correspond to the EUV light generating apparatus 100 including the gas jet 160 as described with reference to FIGS. 1 to 3 or an EUV light generating apparatus including one of the gas jets 160a, 160b, 160c, 160d, 160e, and 160f as described with reference to FIGS. 5 to 10.

The illumination optical system 220 may include a plurality of mirrors and may transmit the EUV light EL output from the EUV light generating apparatus 210 to a mask M. For example, the EUV light EL from the EUV light generating apparatus 210 may be reflected from the plurality of mirrors in the illumination optical system 220 and may be incident on the mask M arranged on the mask support 230.

The mask M may be a reflective mask including a reflection region and a non-reflective region and/or a mid-reflection region. The mask M may include or may be formed of a reflective multilayer for reflecting the EUV light EL and an absorbent layer pattern formed on the reflective multilayer on a substrate W including a low thermal expansion coefficient material (LTEM) such as quartz. The reflective multilayer may have, for example, a structure in which molybdenum (Mo) layers and silicon (Si) layers are alternately stacked on each other in dozens of layers. The absorbent layer may include or may be formed of, for example, TaN, TaNO, TaBO, nickel (Ni), gold (Au), silver (Ag), carbon (C), tellurium (Te), platinum (Pt), palladium (Pd), or chrome (Cr). However, the material of the reflective multilayer and the material of the absorbent layer are not limited to the above-described materials. The absorbent layer may correspond to the non-reflective region and/or the mid-reflection region.

The mask M reflects the EUV light EL incident through the illumination optical system 220, and the reflected EUV light EL may be incident on the projection optical system 240. For example, the mask M may reflect the light incident through the illumination optical system 220, and the reflected light may have patterns of intensity based on a shape of the pattern including the reflective multilayer. The reflected light may be projected onto the substrate W. The absorbent layer on the substrate W may receive the projection light via the projection optical system 240. The projection light may have diffraction patterns with at least secondary diffraction order due to the pattern on the mask M. The projection light may form an image corresponding to the pattern of the mask M on the substrate W. The projection light may pass through the projection optical system 240 and may be incident on the substrate W via the projection optical system 240 with shape information of the pattern on the mask M. The substrate W may be a substrate including a semiconductor material such as Si, for example, a wafer.

The substrate W may be arranged on the substrate stage 250. The substrate stage 250 may move in a direction parallel with or perpendicular to a main surface of the substrate stage 250 with the substrate W mounted thereon.

The projection optical system 240 may include a plurality of mirrors 241 and 243. In FIG. 11, only the two mirrors 241 and 243 are illustrated in the projection optical system 240 for the sake of convenience. The projection optical system 240 may include more mirrors. For example, the projection optical system 240 may include four to eight mirrors.

In exemplary embodiments, the EUV light generating apparatus 210 may prevent the particles from being generated due to the spitting phenomenon by preventing the debris of the droplet DL from being accumulated near the second end 119 of the vessel 110. According to the example embodiments of the inventive concept, the equipment defects caused by the particles generated due to the spitting phenomenon, in particular, the mask defects caused by the particles attached to the mask M, are reduced, and the reliability of the lithography process using the lithography apparatus 200 may increase.

While the inventive concept has been particularly shown and described with reference to embodiments thereof, it will be understood that various changes in form and details may be made therein without departing from the spirit and scope of the following claims.

What is claimed is:

1. An extreme ultraviolet (EUV) light generating apparatus comprising:
    a vessel including a first end and a second end opposite to each other and providing an internal space extending from the first end to the second end;
    a concave mirror adjacent to the first end of the vessel;
    a droplet generator configured to supply a droplet to the internal space of the vessel;
    a laser light source configured to irradiate a laser beam to the droplet in the internal space of the vessel, the irradiated droplet emitting EUV light; and
    a gas jet configured to receive a flow control gas and spray the received flow control gas into the internal space of the vessel,
    wherein the gas jet comprises a ring-shaped main body including a plurality of nozzles spaced apart from one another in a circumferential direction,
    wherein the plurality of nozzles are configured to spray the received flow control gas in a downward direction extending from the second end of the vessel to the first end of the vessel,
    wherein the ring-shaped main body of the gas jet is inserted into a groove formed at an internal wall of the vessel,
    wherein the ring-shaped main body of the gas jet comprises a lower surface and an upper surface opposite to each other, a distance between the lower surface of the ring-shaped main body and the first end of the vessel is smaller than a distance between the upper surface of the ring-shaped main body and the first end of the vessel,
    wherein each of the plurality of nozzles is an opening of the ring-shaped main body disposed at the lower surface of the ring-shaped main body, and
    wherein the opening of the ring-shaped main body is spaced apart from the internal wall of the vessel.

2. The EUV light generating apparatus of claim 1, further comprising:
an exhaust pump configured to exhaust a gas in the vessel through an exhaust port of the vessel,
wherein the gas jet is between the exhaust port of the vessel and the second end of the vessel.

3. The EUV light generating apparatus of claim 1,
wherein the gas jet further comprises an inlet pipe configured to receive a flow of the flow control gas from a gas source, and
wherein the ring-shaped main body of the gas jet comprises a distribution channel configured to guide the flow of the flow control gas transmitted by the inlet pipe to the plurality of nozzles.

4. The EUV light generating apparatus of claim 3,
wherein the distribution channel comprises a first distribution channel and two second distribution channels,
wherein the first distribution channel is configured to:
divide the flow of the flow control gas transmitted by the inlet pipe into divided flows of the flow control gas; and
transmit each of the divided flows of the flow control gas to a corresponding one of the two second distribution channels, and
wherein each of the two second distribution channels is configured to transmit a corresponding divided flow of the flow control gas transmitted by the first distribution channel to two corresponding nozzles among the plurality of nozzles of the ring-shaped main body.

5. The EUV light generating apparatus of claim 1,
wherein the gas jet comprises:
an inlet pipe configured to receive a flow of the flow control gas provided by a gas source; and
a branch pipe connected to the ring-shaped main body and configured to:
divide the received flow of the flow control gas transmitted by the inlet pipe into divided flows of the flow control gas; and
transmit each of the divided flows of the flow control gas to at least two corresponding nozzles among the plurality of nozzles of the ring-shaped main body.

6. The EUV light generating apparatus of claim 5,
wherein the branch pipe comprises a first branch pipe and two second branch pipes,
wherein the first branch pipe is configured to:
divide the received flow of the flow control gas transmitted by the inlet pipe into divided flows of the flow control gas; and
transmit each of the divided flows of the flow control gas to a corresponding one of the two second branch pipes, and
wherein each of the two second branch pipes is configured to transmit a corresponding divided flow of the flow control gas transmitted by the first branch pipe to two corresponding nozzles among the plurality of nozzles of the ring-shaped main body.

7. The EUV light generating apparatus of claim 1,
wherein each of the plurality of nozzles is in a form of a slit extending in the circumferential direction of the ring-shaped main body.

8. The EUV light generating apparatus of claim 7,
wherein the gas jet further comprises a plurality of flow guide plates extending downwardly from the ring-shaped main body to guide the flow control gas sprayed from the plurality of nozzles, respectively.

9. The EUV light generating apparatus of claim 1,
wherein the flow control gas comprises hydrogen.

10. The EUV light generating apparatus of claim 1,
wherein the gas jet comprises metal.

11. The EUV light generating apparatus of claim 1,
wherein the internal space of the vessel is cone-shaped to have a width decreasing from the first end of the vessel to the second end of the vessel, and
wherein the gas jet is configured to spray the flow control gas through the plurality of nozzles in a direction inclined at an angle in a range of from about −30° to about +30° with respect to a central axis direction of the internal space of the vessel.

12. The EUV light generating apparatus of claim 1, further comprising:
an exhaust pump configured to exhaust a gas in the vessel through an exhaust port of the vessel, wherein the exhaust port of the vessel is between the gas jet and the droplet generator.

13. An extreme ultraviolet (EUV) light generating apparatus comprising:
a vessel including a first end and a second end opposite to each other and providing an internal space extending from the first end to the second end;
a concave mirror adjacent to the first end of the vessel;
a droplet generator configured to supply a droplet to the internal space of the vessel;
a laser light source configured to irradiate a laser beam to the droplet in the internal space of the vessel, the irradiated droplet emitting EUV light;
an exhaust pump configured to exhaust a gas in the vessel through an exhaust port of the vessel; and
a gas jet between the exhaust port of the vessel and the second end of the vessel and configured to spray a flow control gas into the internal space of the vessel in a downward direction extending from the second end of the vessel to the first end of the vessel,
wherein the gas jet comprises a ring-shaped main body mounted at an internal wall of the vessel,
wherein the ring-shaped main body includes a plurality of nozzles spaced apart from one another in a circumferential direction,
wherein the ring-shaped main body of the gas jet is inserted into a groove formed at the internal wall of the vessel,
wherein the ring-shaped main body of the gas jet comprises a lower surface and an upper surface opposite to each other, a distance between the lower surface of the ring-shaped main body and the first end of the vessel is smaller than a distance between the upper surface of the ring-shaped main body and the first end of the vessel,
wherein each of the plurality of nozzles is in a form of a slit extending in the circumferential direction of the ring-shaped main body and disposed at the lower surface of the ring-shaped main body, and
wherein the plurality of nozzles comprise eight or more nozzles spaced apart from one another in the circumferential direction of the ring-shaped main body.

14. The EUV light generating apparatus of claim 13,
wherein the gas jet further comprises an inlet pipe configured to receive the flow control gas,
wherein the ring-shaped main body of the gas jet comprises:
a first distribution channel connected to the inlet pipe and configured to divide a flow of the flow control gas transmitted by the inlet pipe into two divided flows of the flow control gas; and second distribution channels connected to opposite ends of the first distribution channel, respectively, and wherein each of the second distribution channels is configured to:
  receive a corresponding divided flow of the two divided flows;
  divide the corresponding divided flow of the flow control gas transmitted by the first distribution channel into further-divided flows of the flow control gas; and
  transmit each of the further-divided flows of the flow control gas to two corresponding nozzles among the plurality of nozzles included in the ring-shaped main body.

15. The EUV light generating apparatus of claim 13, wherein the gas jet comprises:
  an inlet pipe configured to receive a flow of the flow control gas from a gas source;
  a first branch pipe including two paths into which the flow control gas transmitted by the inlet pipe is divided;
  a second branch pipe extending between an end of one of the two paths of the first branch pipe and the ring-shaped main body; and
  a third branch pipe extending between an end of the other of the two paths of the first branch pipe and the ring-shaped main body, and wherein each of the second and third branch pipes is configured to:
  divide a flow of the flow control gas transmitted by the first branch pipe into divided flows of the flow control gas; and
  transmit the divided flows of the flow control gas to two nozzles among the plurality of nozzles included in the ring-shaped main body.

16. The EUV light generating apparatus of claim 13, wherein lengths of the plurality of nozzles extending in the circumferential direction of the ring-shaped main body are equal to one another, and wherein the plurality of nozzles are spaced apart from one another at regular intervals in the circumferential direction of the ring-shaped main body.

17. The EUV light generating apparatus of claim 13, wherein the plurality of nozzles extend to be inclined with respect to a central axis direction of the internal space of the vessel.

18. A lithography apparatus comprising:
  an extreme ultraviolet (EUV) light generating apparatus configured to output EUV light, wherein the EUV light is reflected by a mask provided to the lithography apparatus; and
  a substrate stage configured to support a substrate, wherein the EUV light reflected from the mask irradiates on the substrate, wherein the EUV light generating apparatus comprises:
  a vessel including a first end and a second end opposite to each other and providing an internal space extending from the first end to the second end;
  a concave mirror adjacent to the first end of the vessel;
  a droplet generator configured to supply a droplet to the internal space of the vessel;
  a laser light source configured to irradiate a laser beam to the droplet in the internal space of the vessel, the irradiated droplet emitting the EUV light; and
  a gas jet configured to receive a flow control gas and spray the received flow control gas into the internal space of the vessel, wherein the gas jet comprises a ring-shaped main body mounted at an internal wall of the vessel and including a plurality of nozzles spaced apart from one another in a circumferential direction, wherein the gas jet is configured to spray the received flow control gas through the plurality of nozzles in a downward direction extending from the second end of the vessel to the first end of the vessel, wherein the ring-shaped main body of the gas jet is inserted into a groove formed at the internal wall of the vessel, wherein the ring-shaped main body of the gas jet comprises a lower surface and an upper surface opposite to each other, a distance between the lower surface of the ring-shaped main body and the first end of the vessel is smaller than a distance between the upper surface of the ring-shaped main body and the first end of the vessel, wherein each of the plurality of nozzles is an opening of the ring-shaped main body disposed at the lower surface of the ring-shaped main body, and wherein the opening of the ring-shaped main body is spaced apart from the internal wall of the vessel.

* * * * *